United States Patent
Durner et al.

(10) Patent No.: US 9,614,494 B2
(45) Date of Patent: Apr. 4, 2017

(54) REACTANCE FILTER COMPRISING ACOUSTIC WAVES RESONATORS

(71) Applicant: EPCOS AG, Munich (DE)

(72) Inventors: Ralph Durner, San Diego, CA (US); Ravi Kiran Challa, Rancho Santa Margarita, CA (US); Wolfgang Till, San Diego, CA (US); Aleh Loseu, Santee, CA (US)

(73) Assignee: SNAPTRACK, INC., San Diego, CA (US)

( * ) Notice: Subject to any disclaimer, the term of this patent is extended or adjusted under 35 U.S.C. 154(b) by 0 days.

(21) Appl. No.: 14/763,494

(22) PCT Filed: Mar. 15, 2013

(86) PCT No.: PCT/EP2013/055439
§ 371 (c)(1),
(2) Date: Jul. 24, 2015

(87) PCT Pub. No.: WO2014/139590
PCT Pub. Date: Sep. 18, 2014

(65) Prior Publication Data
US 2015/0365069 A1  Dec. 17, 2015

(51) Int. Cl.
*H03H 7/38* (2006.01)
*H03H 9/205* (2006.01)
(Continued)

(52) U.S. Cl.
CPC ............ *H03H 9/205* (2013.01); *H01F 38/14* (2013.01); *H03H 9/02015* (2013.01);
(Continued)

(58) Field of Classification Search
CPC ............... H03H 9/205; H03H 9/02015; H03H 9/02543; H03H 9/542; H03H 9/602;
(Continued)

(56) References Cited

U.S. PATENT DOCUMENTS

| 5,726,610 | A | 3/1998 | Allen et al. | |
| 5,952,899 | A | 9/1999 | Kadota et al. | |
| 6,262,637 | B1* | 7/2001 | Bradley | H03H 9/706 310/322 |
| 6,492,194 | B1* | 12/2002 | Bureau | H01L 21/56 257/E21.502 |

(Continued)

FOREIGN PATENT DOCUMENTS

| EP | 0422637 A2 | 4/1991 |
| EP | 0541284 A1 | 5/1993 |

(Continued)

OTHER PUBLICATIONS

Hikita, M., et al., "Design Methodology and Experimental Results for New Ladder-Type SAW Resonator Coupled Filters," IEEE Transactions on Ultrasonics, Ferroelectrics, and Frequency Control, vol. 42, No. 4, Jul. 1995, pp. 495-508.

*Primary Examiner* — Robert Pascal
*Assistant Examiner* — Kimberly Glenn

(57) ABSTRACT

A reactance filter includes a series branch that includes a number of series impedance elements that are coupled in series and a number of parallel branches each having a parallel impedance element coupled to a respective node of the series branch. Each impedance element includes a resonator that works with acoustic waves. The resonators in the series branch include a first piezoelectric material and the resonators in the parallel branches include a second piezoelectric material that is different than the first piezoelectric material.

20 Claims, 5 Drawing Sheets

(51) Int. Cl.
- *H03H 9/02* (2006.01)
- *H03H 9/54* (2006.01)
- *H03H 9/60* (2006.01)
- *H03H 9/64* (2006.01)
- *H01F 38/14* (2006.01)
- *H03H 9/70* (2006.01)
- *H03H 9/72* (2006.01)

(52) U.S. Cl.
CPC ........ *H03H 9/02543* (2013.01); *H03H 9/542* (2013.01); *H03H 9/605* (2013.01); *H03H 9/6483* (2013.01); *H03H 9/706* (2013.01); *H03H 9/725* (2013.01); *H01F 2038/146* (2013.01)

(58) Field of Classification Search
CPC ...... H03H 9/6483; H03H 9/706; H03H 9/725; H01F 38/14; H01F 2038/146
USPC ........................................... 333/131
See application file for complete search history.

(56) References Cited

U.S. PATENT DOCUMENTS

| | | | |
|---|---|---|---|
| 7,126,253 B2* | 10/2006 | Unterberger | H03H 9/605 310/320 |
| 2006/0028298 A1 | 2/2006 | Nakamura et al. | |
| 2008/0074212 A1 | 3/2008 | Matsuda et al. | |
| 2010/0110940 A1* | 5/2010 | Hara | H03H 9/0571 370/277 |
| 2012/0194294 A1 | 8/2012 | Nishizawa | |
| 2012/0286896 A1 | 11/2012 | Takamine | |
| 2013/0170405 A1 | 7/2013 | Yan et al. | |

FOREIGN PATENT DOCUMENTS

| | | |
|---|---|---|
| EP | 2530837 A1 | 12/2012 |
| JP | 200459849 A | 2/2004 |
| WO | 2011092879 A1 | 8/2011 |
| WO | 2013128636 A1 | 9/2013 |

* cited by examiner

REACTANCE FILTER COMPRISING ACOUSTIC WAVES RESONATORS

This patent application is a national phase filing under section 371 of PCT/EP2013/055439, filed Mar. 15, 2013, which is incorporated herein by reference in its entirety.

TECHNICAL FIELD

Embodiments relate to a reactance filter that includes resonators operating with acoustic waves.

BACKGROUND

In modern wireless communication standards, a couple of frequency bands are defined by their respective middle frequencies, bandwidths and duplex distance. A respective frequency band may comprise a Tx band that is used for transmission of signals at a user's phone, the direction is also called upstream, and an Rx band used for reception of signals, the direction is also called downstream. The band distance describes a frequency interval separating the frequencies of a transmission signal and a receive signal. A band pass filter used for a Tx or a Rx band needs a steep skirt a the side of the pass band that is facing the adjacent Rx or Tx band such that the attenuation in the adjoining band is above the required value.

The growing demand for more bandwidth necessary for new wireless services results in challenging frequency band definitions. One example is band 28 being an APEC specific application. The Tx band is from 703 to 748 MHz and the respective Rx band from 758 to 803 MHz complying with a bandwidth of 6% and a band distance of 10 MHz. This definition is challenging because the two requirements of a large bandwidth of nearly 6% and a small band distance of 10 MHz are nearly impossible to be realized at the same time by a front-end circuit based on filters working with surface acoustic waves. A further challenge is the temperature coefficient of frequency (TCF) which means that filter properties such as middle frequencies and hence, filter skirts too change with temperature. Hence, in spite of a given TCF a filter must obey the definitions of a band at each temperature within a temperature interval complying with normal environmental conditions.

An electro-acoustic band pass filter realized on a standard lithium tantalate piezoelectric material complies with the required small band distance and the skirt steepness resulting therefrom. But such a filter cannot satisfy the bandwidth requirement and is far from reaching it. On the other side, a band pass filter realized on a standard lithium niobate piezoelectric material can reach a bandwidth of about 6% but is far from complying with the demands in view of the skirt steepness. This is due to its relatively large TCF (temperature coefficient of frequency) of about 80 ppm/K.

SUMMARY

As both standard piezoelectric materials are not appropriate for realizing a band pass filter that complies with the definition of the above-mentioned band 28. Embodiments of the invention provide a band pass filter operating with acoustic waves that can comply with challenging demands of, for example, band 28.

The invention provides a reactance filter comprising impedance elements arranged in a ladder-type structure or a lattice-type structure. The reactance filter comprises a series branch wherein a number of series impedance elements are coupled in series. In a ladder type filter parallel branches are connecting the series branch to ground and in a lattice type filter parallel branches are connecting two series branches. Each parallel branch comprises a parallel impedance element. Each of the parallel and series impedance elements comprises a resonator, a series circuit of such a resonator and a series inductance element, or a resonator and a capacitance element coupled in parallel. All resonators operate with acoustic waves. The first resonators of the first impedance elements in the series branch comprise a first piezoelectric material whereas the second resonators of the second impedance elements in the parallel branches comprise a second piezoelectric material different from the first piezoelectric material.

This means that in the reactance filter, first and second resonators of the series impedance elements and the parallel impedance elements respectively are built up on different piezoelectric materials and can thus be independently optimized in view of a specific condition chosen from a steep skirt or a large bandwidth. First and second resonators are independently chosen from SAW resonators (SAW=Surface Acoustic Wave) and resonators working with bulk acoustic waves. The latter one can be chosen from BAW resonators and GBAW resonators (BAW=Bulk Acoustic Wave; GBAW=Guided Bulk Acoustic Wave).

An important factor determining the bandwidth of a resonator and in consequence determining the bandwidth of a filter is the electro mechanic coupling of the respective piezoelectric material the resonator is build-up from. Hence, first and second resonators are realized in first and second piezoelectric materials, both piezoelectric materials deferring mostly in their coupling. The resonators of at least one type of resonators are realized on a piezoelectric material having a relatively high coupling coefficient while the resonators of the respective other type are realized in a piezoelectric material having a relatively low coupling coefficient. Preferably piezoelectric materials with lower coupling have a lower TCF.

A higher coupling enhances the distance between the main resonance and the anti-resonance of resonator. This distance is also called the pole zero distance directly corresponding to the bandwidth of the filter.

The assignment of a respective piezoelectric material to a first or a second resonator depends on the demands the respective filter and hence the respective pass band of the filter has to fulfill. A filter that needs to have a steep skirt at the low frequency side of its pass band needs a second piezoelectric material having a lower coupling than the first piezoelectric material. On the other side, a filter needing a steep skirt at the high frequency side of its pass band can be realized by selecting a first piezoelectric material having a lower coupling coefficient than the second piezoelectric material.

This is due to the fact that the second resonators arranged in the parallel branches of the reactance filters are responsible for the left skirt of the pass band while the series resonators of the reactance filters are responsible for creating the right skirt facing the high-frequency side of the pass band.

In an embodiment, at least a impedance element of the series branch or the parallel branches that are selected to produce the lower bandwidth and thus the lower coupling is realized by a parallel circuit of a resonator and a capacitance element. By doing this, the bandwidth of the respective impedance element is further reduced. The parallel capacitance elements adds its capacitance to the static capacitance of the resonator and hence enhances the capacitance ratio r of static capacitance to dynamic capacitance of a resonator. An enhanced capacitance ratio produces a reduced bandwidth because pole-zero distance pzd depends on r according to the formula:

$$pzd=\sqrt{(1+1/r)}-1$$

It is possible to exclusively use a parallel circuit of a resonator and a capacitance element instead of a low coupling first or second resonator alone.

According to further embodiments of the invention, any kind of means for affecting the bandwidth or the coupling of a resonator in a desired way can be used for the respective type of resonators chosen from first and second resonators.

A means for enhancing the bandwidth of a resonator is a series inductance element that is coupled in series to one or more of the respective resonators.

A means for reducing the bandwidth of a type of resonators is a dielectric layer deposited on top of the respective resonators. This dielectric layer can be deposited between the piezoelectric material and an electrode of the resonator or on the top electrode of the respective resonators. In case of a SAW resonator, the dielectric layer is deposited to the entire surface carrying the inter-digital electrodes of the SAW resonators. A major effect can be achieved if the dielectric layer is deposited between piezoelectric material and inter-digital electrodes. If a BAW resonator is used as acoustic resonator, the dielectric layer is preferably deposited on top of the top electrode of the BAW resonator.

The general idea of the invention is to use different piezoelectric materials for forming first and second resonators. This can best be realized by using separate substrates for the two types of resonators, i.e., first and second resonators. A substrate can be a bulk piece of a piezoelectric material, that is a chip cut from a crystal of a piezoelectric material. The substrate can also be a carrier for a layer of piezoelectric material deposited thereon. Separate substrates for first and second resonators have the advantage that the two substrates can be processed separately to individually optimize each of the two substrates in view of the desired properties of the resonators. Using separate substrates allows applying homogenous methods affecting the entire surface of a substrate and needs not differentiating between first and second resonators like it would be on a common substrate.

A first substrate can be optimized to provide a large bandwidth while a second substrate can be optimized to achieve resonators having a steep skirt on a desired side of their pass band. A steep skirt is normally assigned to a low bandwidth and/or to a low temperature coefficient of frequency. Hence, according to this embodiment the bandwidth of the second resonators on the second substrate is reduced.

In another embodiment, first and second substrates can be optimized in a contrary manner that is a first substrate in view of a low bandwidth and/or a low temperature coefficient of frequency while the second substrate is optimized in view of a large bandwidth.

In a further embodiment, the resonators that are assigned to have the greater coupling are realized as SAW resonators. On the other side, resonators assigned to provide a smaller coupling coefficient and hence a steep filter skirt can be realized as BAW resonators.

A reactance filter whose first and second resonators are realized on separate substrates needs coupling means for electrically connecting first and second impedance elements in a ladder-type or lattice-type structure. This can be done directly. But it is preferred to use a circuit board for electrically coupling first and second impedance elements.

The circuit board provides electrical connection lines connecting two connection pads each. The two substrates have bonding pads that are connected to a respective resonator each and electrically coupled to a respective connection pad just by mounting the substrates on top of the circuit board. Then, all electrical couplings between the series branch and the parallel branches are made by the connection lines that are formed on or within the circuit board.

When arranging the two substrates on a common circuit board which may be made from a ceramic or an organic laminate, it is possible to use a common package for encapsulating first and second substrate on the common circuit board. This can be done by a arranging a cover sealing to the top surface of the circuit board thereby encapsulating first and second substrate under the cover.

The cover may be a rigid cover in the form of a cap providing a cavity between cap and circuit board and enclosing the two substrates in the cavity.

According to another embodiment, the cover is a film that may comprise a polymer foil which may be laminated on top of the circuit board, thereby covering the first and second substrate mounted on top of the circuit board. The laminated foil may comprise two or more sub-layers that may be equal or different in material and thickness. Further, the foil may be a hermetically tight foil comprising a metallic sub-layer. The metallic sub-layer may be deposited as a metallic film on the cover.

Within a package, the reactance filter comprises first and second substrates carrying at least the first and second resonators where first resonators are realized in the first substrate and second resonators are realized in the second substrate. All connections between the serial branch realized in the first substrate and the given number of parallel branches which are realized in the second substrate are made via connection lines are realized on top of the circuit board or within a metallization layer within a multi-layer circuit board. The connections between the substrates and the circuit board may be made by bump connections between a bonding pad on the substrate and a connection pad on the circuit board.

The bonding pad on the first substrate may be arranged that each resonator is neighbored by two first bonding pads. Each first bonding pad is connected to a first connection pad that is connected to a second connection pad on the circuit board via a connection line. The second connection pad is connected to a second bonding pad arranged on the second substrate and electrically coupled to a parallel branch. Input and output of electrical signals may be done by the respective outermost first bonding pads on the first substrate. As these outermost first bonding pads may be coupled to first connection pads, input and output are coupled to the respective outermost first connection pad on the circuit board.

According to an embodiment, the first substrate comprises a number of n first resonators where n is an integer with $2 \leq n \leq 6$. Then, the first substrate comprises at least n+1 first bonding pads. As each of the first bonding pads is assigned to a first connection pad on the circuit board, the circuit board comprises n+1 first connection pads. The second substrate comprises a number of m second resonators where m is an integer with $n-1 \leq m \leq n+1$. Each second bonding pad is coupled to a parallel branch and comprises a respective second resonator. Each second bonding pad is bonded to a second connection pad to achieve a coupling to the first bonding pad and hence to the serial branch within the first substrate via the connection line and the first connection pads.

As each parallel branch is coupled between the serial branch and a ground connection, the reactance filter needs at least one ground connection that is coupled to each of the parallel branches. Hence, it is possible to interconnect the ground-sided ends of the parallel branches via a common grounding line on top of the second substrate.

According to another embodiment, it is possible to connect each parallel branch separately via a respective grounding pad to a respective ground contact on top of the circuit board and to interconnect all ground contacts via a connection line to a ground terminal of the reactance filter.

According to another embodiment, it is possible to interconnect a desired number of the ground-sided ends of the parallel branches on top of the second substrate where this desired number may be $\geq 2$ but $<m$.

Electrical connections between bonding pads and connection pads may be done via bumps when mounting the respective substrate in flip chip technology on top of the circuit board. The bumps may be solder bumps or stud bumps.

As already mentioned, the circuit board comprises at least one ground contact that is connected via an inductive line to a ground terminal of the circuit board. The ground terminal is an external terminal and arranged on the bottom of the circuit board facing away from the top surface where the substrates are mounted on. Input and output terminal of the reactance filter are arranged on the same bottom surface and connected to the respective connection pads via a through contact through the circuit board. Alternatively conductive lines may be guided from the top surface of the circuit board around the edges to the respective terminal on underside of the circuit board.

According to an embodiment, connections between connection pads and external solder pads (terminals) on the bottom of the circuit board may comprise inductive lines that are formed by conductor lines within or on top of the circuit board. If such an inductive line needs a high inductance value, the line may be realized by curved lines that may form windings of a coil. The coil may be formed like a spiral or a helix and may comprise conductor sections arranged in different metallization plains of the multi-layer circuit board.

Further series inductance elements may be coupled in series to a resonator each and may be formed as an inductive line on top of the respective substrate or within the circuit board.

According to further embodiment, the reactance filter may be part of a duplexer. A duplexer comprises a transmitting filter usually called Tx filter and a reception filter (Rx filter), both filters operating in separate but usually adjoining frequency bands. At least one of the Tx or Rx filter of a duplexer may be a reactance filter as described above.

According to another embodiment, both filters of the duplexer may be realized by a reactance filter as described. If there is only a small gap between the frequency bands of the Tx filter and the Rx filter the filter operating in the lower of the two frequency bands, that is usually the Tx filter, needs a steep right filter skirt. On the other side, the filter operating in the higher frequency band needs a steep filter skirt on the left side to provide enough attenuation in the respective neighbored frequency band.

According to an embodiment, the reactance filter of a duplexer that operates in the lower frequency band has second resonators based on a second piezoelectric material that has a greater coupling coefficient than the first piezoelectric material on which the first resonators are based. Vice-versa, the other filter of the duplexer that is the reactance filter that operates in the higher frequency band has first resonators based on a first piezoelectric material that has a greater coupling coefficient than a second piezoelectric material where the second resonators are based on.

A second acoustic resonator based on a second piezoelectric material showing a smaller coupling coefficient than the first piezoelectric material produces a steep skirt on the lower frequency side of the pass band of the reactance filter. If the coupling coefficient of the first piezoelectric material is chosen high enough, the reactance filter shows a sufficiently high bandwidth. Vice-versa, if the first piezoelectric material is chosen to have the smaller piezoelectric coupling coefficient, this produces a pass band having a steep skirt on the higher frequency side of the pass band.

BRIEF DESCRIPTION OF THE DRAWINGS

The reactance filter is explained in more detail by a series of embodiments and accompanied schematic figures. The figures are not drawn to scale and some details may be depicted enlarged for better understanding.

DETAILED DESCRIPTION OF ILLUSTRATIVE EMBODIMENTS

Figure 1:
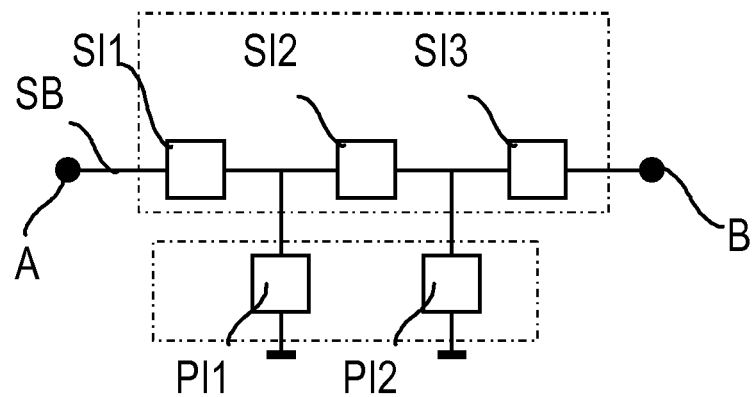
FIG. 1 shows a general embodiment with first and second impedance elements.

FIG. 1 schematically shows a general block diagram of a reactance filter according to the invention. The filter comprises serial and parallel impedance elements SI,PI arranged in a ladder-type structure comprising a serial branch SB and a number of parallel branches PB connected thereto. The serial branch SB comprises a signal line connecting terminals A and B. Series impedance elements SI1 to SI3 are arranged in the series branch SB and connected in series between A and B. Between each two adjacent series impedance elements SI, one end of a parallel branch PB is connected to the series branch SB. A first parallel branch PB1 comprises a parallel impedance element PI1, a second parallel branch PB2 comprises a second parallel impedance element PI2.

On the bottom part of FIG. 1, embodiments A to C are given to provide examples for realizing the impedance element SI or PI. A impedance elements SI,PI may be a resonator R only according to embodiment A, a series connection of a resonator R and a series inductance element PIN or a parallel circuit of a resonator R and a capacitive element CE according to embodiment C.

Not deviating from the invention more or less impedance elements may be chosen and arranged in series or in parallel when designing an reactance filter.

Series impedance elements SI defer from the parallel impedance elements PI at least by the piezoelectric material of the respective resonator. Hence, all properties that are assigned to a selected piezoelectric material are different in the first and second resonators which represent or are part of the respective impedance element SI, PI. Most important for the desired property of the reactance filter is the coupling coefficient of the piezoelectric material which should best be substantially different in both types of impedance elements. It is advantageous to select a high coupling piezoelectric material and a low coupling piezoelectric material for realizing first and second resonators. In a preferred embodiment, lithium tantalate 42° rotXY is chosen as a low coupling substrate. This piezoelectric material can be combined with a high coupling substrate, preferably with a lithium niobate 41° rotXY or 64° rotXY. These both lithium niobate materials show a relatively high coupling coefficient and thus provide a high coupling.

In order to design a Tx filter of a duplexer having a frequency band directly adjacent to the higher frequency band of the Rx filter, the first resonators of the Tx reactance filter are chosen from a low coupling material that is from the mentioned lithium tantalate. The second resonators of the second impedance elements of the Tx filter are chosen from the above-mentioned lithium niobate. Such a Tx filter complies with the required specifications of band 28. A filter of about 6% relative bandwidth can be designed according to the above-mentioned preferred embodiment using said two different piezoelectric materials for the first and second resonators. The designed Tx filter is able to keep a band distance of 10 MHz and thus, provides a necessary attenuation in the Rx band.

As stated above, first and second resonators have to show different couplings. Hence, all measures that affect the coupling in a desired direction can be applied within a reactance filter of the mentioned kind. Using a series circuit of a resonator R and an inductance element PIN as an impedance element SI,PI enhances the coupling of the resonator.

According to FIG. 1, embodiment C, a parallel circuit of a resonator R and a capacitive element CE results in an impedance element wherein the coupling of the resonator R is reduced. Such a circuit can be used for the first impedance elements when the reactance filter is used as a Tx filter operating in the lower frequency band with regard to the Rx frequency band. The series circuit of inductance element and resonator is then preferably used for designing the second impedance elements.

Figure 2:
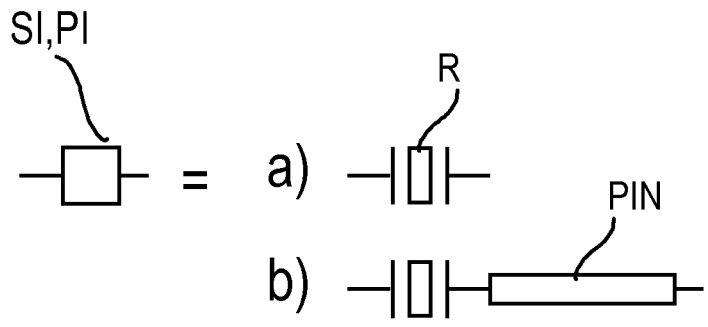
FIG. 2 shows a second embodiment comprising first and second resonators.
Figure 2:
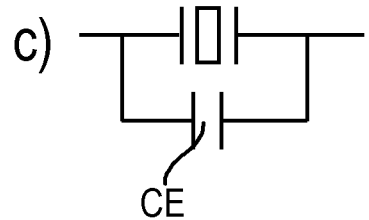
Figure 2:
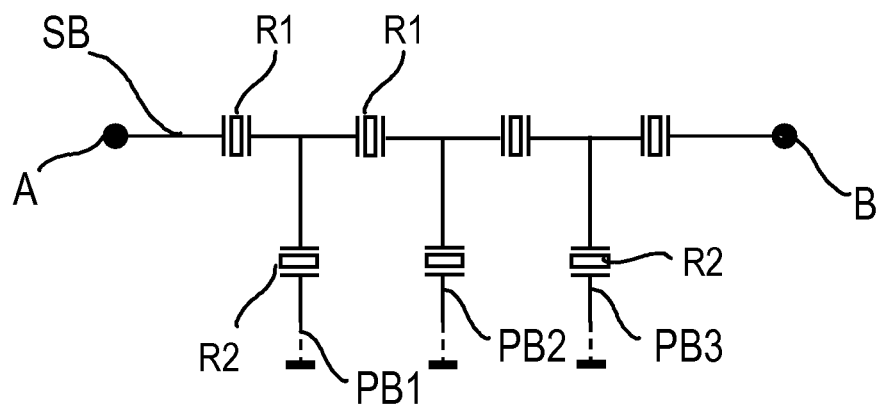

FIG. 2 shows another embodiment where first resonators R1 and second resonators R2 are used as impedance elements within the reactance filter of a ladder-type structure. In the shown embodiment, four first resonators R1 are arranged within the series branch SB connecting points A and B. Between each two first resonators R1, a parallel branch PB is coupled to the serial branch SB such that in total three parallel branches PB1 to PB3 are present. Each parallel branch PB connects the serial branch SB and a ground potential.

Each resonator is embodied as a resonator working with acoustic waves such as a SAW resonator or BAW resonator or a resonators working with guided bulk acoustic waves (GBAW). First and second resonators may be manufactured using the same resonator technology. But it is possible, too, to use a first technology for the first resonators and a second technology for the second resonators. BAW resonators, for example, can preferably be used for first resonators for showing a smaller coupling than SAW resonators.

Figure 3:
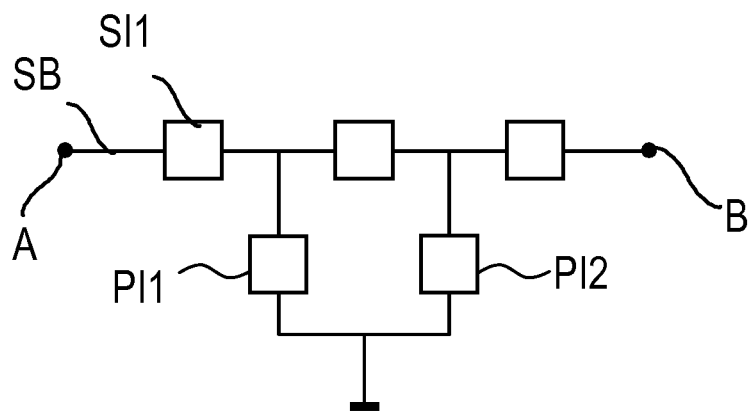
FIG. 3 shows a reactance filter with impedance elements where the parallel branches are connected to a common ground connection.

FIG. 3 schematically shows a ladder-type structure of serial and parallel impedance elements SI and PI. The figure shows a variation of the ground connection of the parallel branches. In this embodiment, the ground sided ends of the parallel branches are interconnected on the second substrate and then coupled to ground potential by a common ground line. This ground connection can be done with a low inductance using short and small conductor lines.

Figure 4:
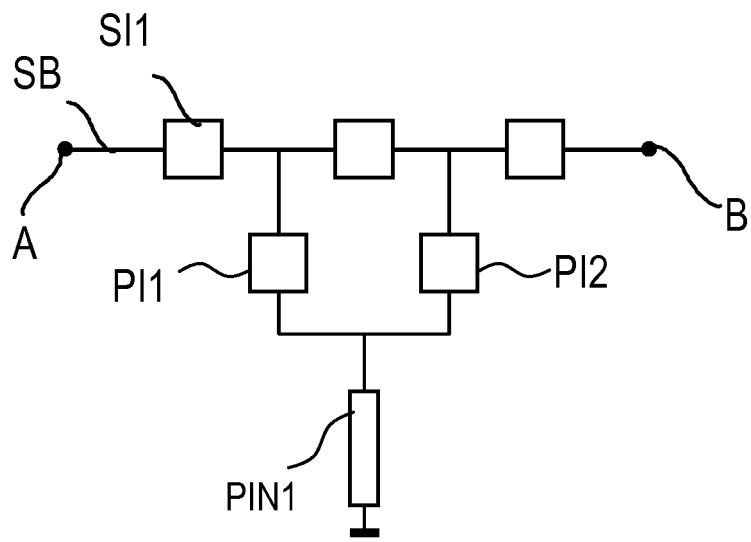
FIG. 4 shows the embodiment of FIG. 3 where the ground connection is done via an inductive line.

FIG. 4 shows an embodiment where, different to the embodiment of FIG. 3, the ground connection is done via a series inductance element PIN1. Such an inductance element can shift the resonant pole of the parallel branches.

Figure 5:
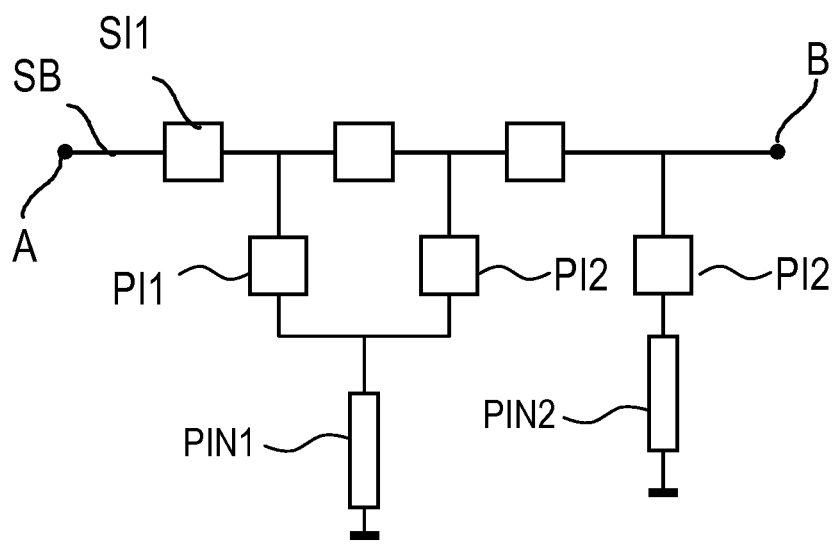
FIG. 5 shows an embodiment where the parallel branches are connected to ground via a number of inductive lines.

FIG. 5 shows an embodiment where three serial impedance elements SI1 and three parallel impedance elements PI1 to PI3 are arranged in a ladder-type structure. Two of the parallel branches with the second impedance elements PI1 and PI2 are interconnected at their ground sides and coupled to ground via a series inductance element PIN1. The remaining second impedance element PI3 is separately connected to ground via another series inductance element PIN2. Even if the two inductance elements PIN1 and PIN2 are of the same inductance value, two different poles can be created which are shifted relative to a ladder-type structure without the inductance elements to the higher frequency side. Choosing two series inductance elements PIN1 and PIN2 of different inductance value can further shift the respective poles.

Figure 6:
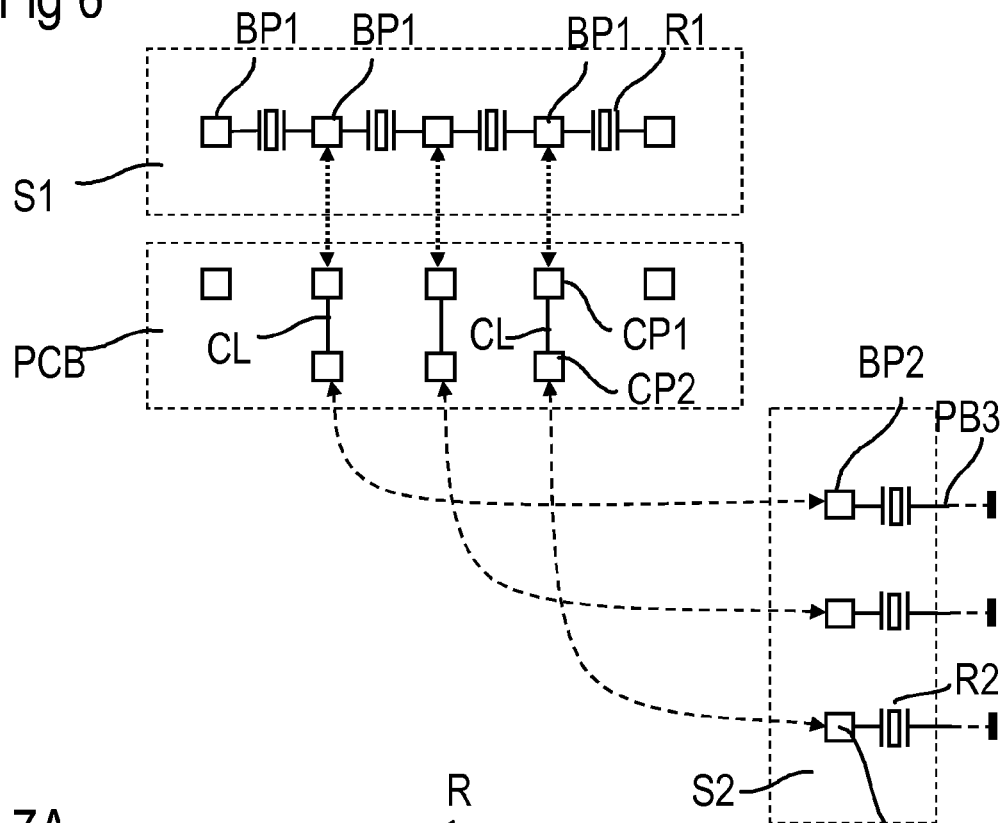
FIG. 6 shows in a schematic way the first and second substrate with according bonding pads and a circuit board with according connection pads that, when connected together, form a ladder type filter.

In the embodiment of FIG. 6, the separation of serial and parallel impedance elements SI,PI, respectively first and second resonators on different substrates S1, S2 is shown. The figure shows how electrical connections between first and second substrate S1, S2, respectively between serial branch SB and parallel branches PB, can be done via the circuit board PCB. On the first substrate S1, four first resonators are arranged within a serial branch SB. Between each two first resonators R1, a first bonding pad BP1 is situated. At both ends of the serial branch, a further bonding pad BP1 is present, respectively. The first bonding pads BP1 are for connecting the parallel branches PB to the serial branch SB as well as for connecting the reactance filter to input and output.

On the second substrate S2, three parallel branches PB1, PB2 and PB3 are arranged, each comprising a second bonding pad BP2 connected to a second resonator R2 each. The ground connection for the three parallel PB is not shown as this may be done in different ways.

First substrate S1 and second substrate S2 comprise different piezoelectric material PM. If a resonator is construed in SAW technology, the piezoelectric material PM may form the substrate S. If one type of first and second resonator is realized as a BAW resonator, the respective substrate S may be a mechanically rigid carrier material onto which the BAW resonators are formed by depositing a first electrode E1, a layer of piezoelectric material PM and a second electrode E2. The electrodes E1, E2 may extend to respective bonding pads. But resonator technology and substrate material can be chosen independently for first and second substrate.

In the figure, the interconnections between first and second substrate are indicated as broken lines. They are preferably realized via the circuit board PCB. The circuit board PCB provides first connection pads CP1 to be connected with first bonding pads BP1 on the first substrate S1 as well as second connection pads CP2 to be connected with second bonding pads BP2 on the second substrate S2. Each first and second connection pad CP1, CP2 are connected via a connection line CL.

Further connection pads are to be connected with input and output of the serial branch SB and thus are not connected to a connection line CL. Then, electrical and mechanical connection between mutually assigned pads is done by a solder process where in first and second substrate are soldered via their connection pads and bonding pads such that first and second substrate are mounted on the circuit board PCB. The connection may also be done via stud bumps needing no solder. The circuit board is preferably a multi-layer board made from an organic laminate or from a multi-layer ceramic-like HTCC (High-Temperature Co-fired Ceramics) or LTCC (Low-Temperature Co-fired Ceramics). Besides the connection pads that must be arranged on top of the circuit board PCB, there may be further metallizations within the circuit board that is between two isolating layers. By these metallizations within the circuit board, passive elements may be formed like inductors, capacitors, or resistors. Further, there are through contacts through the circuit board PCB interconnecting different metallization layers or different conductor sections that are arranged in different metallization plains or which are connecting any metallization plain with an external contact that is a solder pad on the bottom of the circuit board PCB.

If an impedance element comprises an inductive element or a capacitive element as shown in FIGS. 1b and 1c, the respective passive element can be realized within the circuit board PCB. If an impedance element in the first substrate S1 is realized according to FIG. 1B, the necessary respective inductance elements within the series branch SB can be realized in the circuit board, too, if further first bonding pads BP1 are inserted into the serial branch as well as an according number of first connecting pads on top of the circuit board PCB. The electrical connections between two neighbored first bonding pads is then interrupted on top of the first substrate S1 that these two neighbored bonding pads may be bridged by the inductance element in the circuit board PCB. Impedance elements comprising capacitive elements CE as shown in FIG. 1C can be integrated in the circuit board without any problems and without doubling the first bonding pads. The capacitive elements can be arranged by metallization plains arranged within the circuit board and connected to two neighbored first connection pads CP1 to capacitively bridge same. In an embodiment, capacitive elements are realized by transducer structures on top of first or second substrate. This is preferred if the resonators are SAW resonators comprising similar transducers. Preferably the transducers used as capacitive elements and the transducers of the resonators have different pith and hence different resonance frequencies. In addition, capacitive transducers can be rotated by, e.g., 90° to avoid generation of disturbing acoustic waves.

Series inductive elements within the parallel branches can be connected to the open end of each parallel branch and embodied by respective metallizations within the circuit board PCB.

Figure 10:
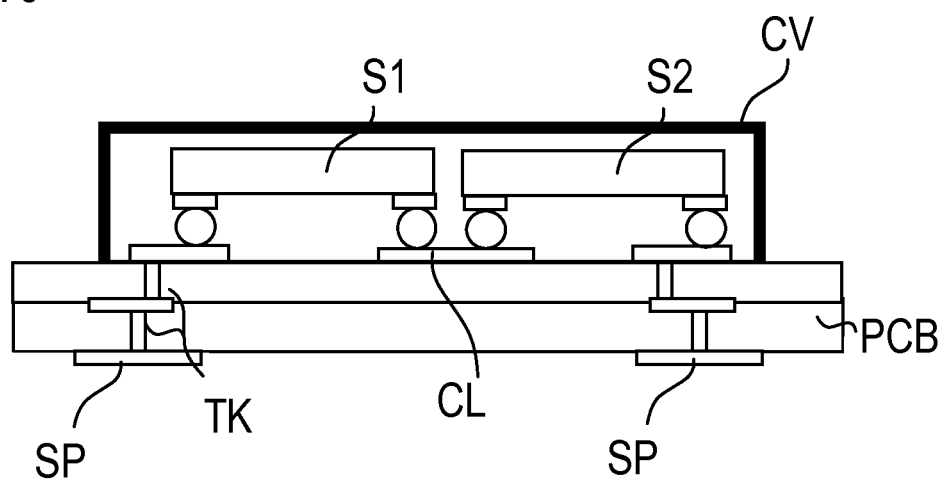
FIG. 10 shows the reactance filter comprising a cover encapsulating first and second substrate.
Figure 11:
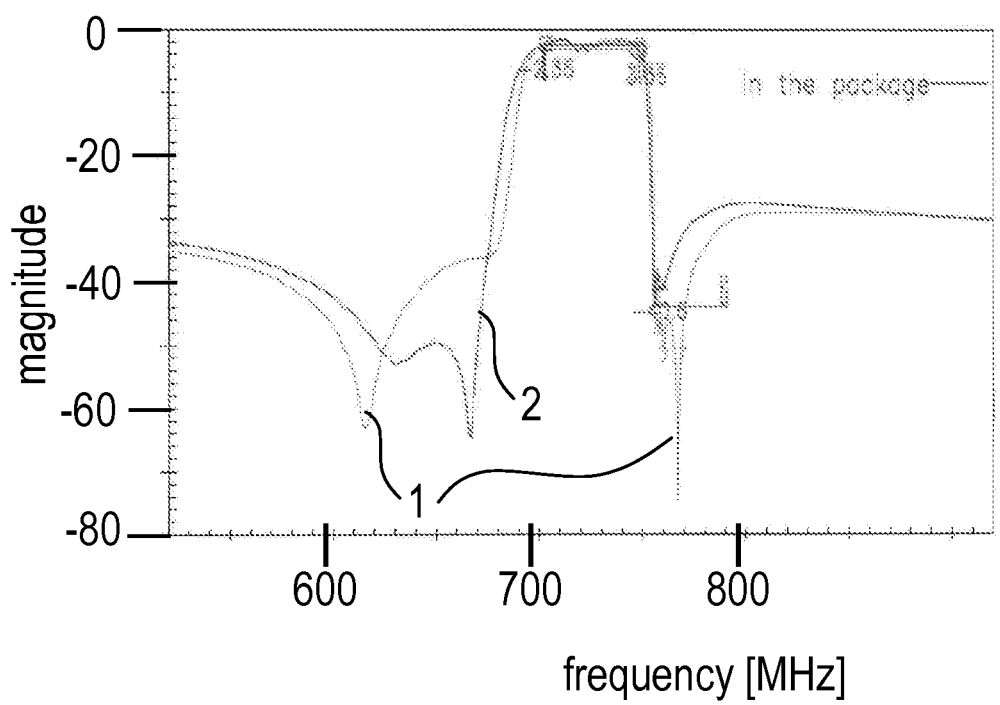
FIG. 11 shows the transmittance curve of a filter according FIG. 6.

In FIG. 11 curve 1 shows the transmittance curve (matrix element S21) of the bare filter according FIG. 6 where SAW resonators are used as serial and parallel impedance elements. First resonators are realized on a LT 42° substrate and second resonators are realized on a LN 41° substrate. Curves 1 shows the pure acoustic behavior of the filter while curve 2 shows the behavior of the filter within a package according to FIG. 10. The package comprises as a circuit board PCB a metallized laminate or a multilayer ceramic circuit board. Inside the package two further series inductances are realized on the circuit board and connected in series to the parallel branch. These series inductances are build up by a combined metal deposition process comprising sputtering of a base metallization and enforcing the base metallization by a galvanic or currentless deposition process in a bath. A resist structure having a thickness of at least the height of the resulting metal structure provides that a coil of exactly adjustable geometrical dimensions is achieved. This guarantees a high quality inductance having a high Q factor and an exactly dimensioned inductance value.

Figure 12:
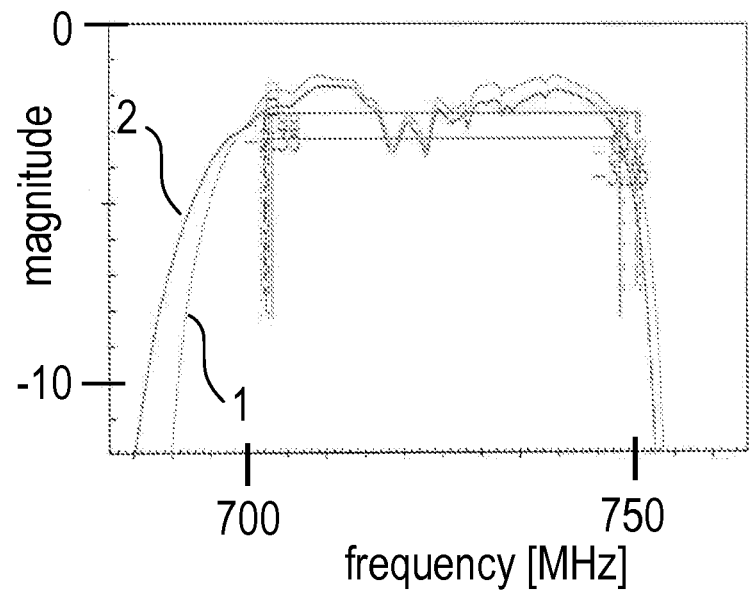
FIG. 12 shows the pass band of FIG. 11 in an enlarged diagram.

FIG. 12 shows the same curves in an enlarged view on the passband. It can be seen that a broad pass band of more than 6% relative bandwidth is achieved. The right skirt of the pass band is steep enough to show the required attenuation on the high frequency side where the Rx frequency band of band 28 is located. This means that the filter fully complies with the specification of band 28 what has never been shown before with a conventional SAW filter.

Figure 7A:
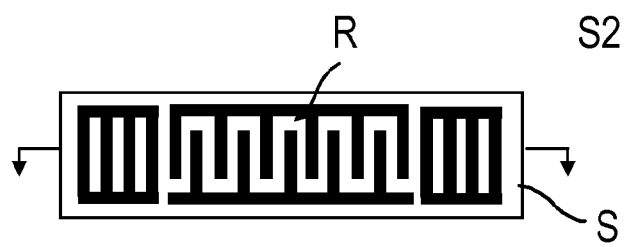
FIG. 7A shows a resonator embodied as a SAW resonator from a top view.
Figure 7B:
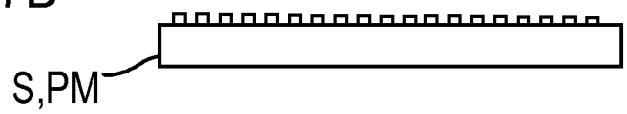
FIG. 7B shows a SAW resonator in a cross-sectional view.

FIG. 7A shows a resonator embodied as a SAW resonator in a top view. The resonator comprises at least an interdigital transducer that may be backed up at both ends by an acoustic reflector. FIG. 7B shows the SAW resonator in a cross-sectional. The piezoelectric material PM may form the substrate S on which the interdigital transducer is formed as an electrode structure.

Figure 8:
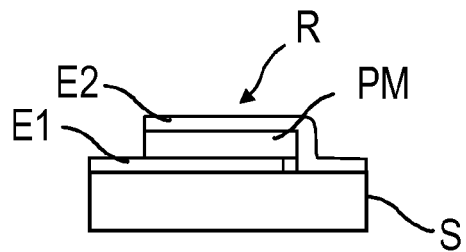
FIG. 8 shows a resonator embodied as a BAW resonator in a cross-sectional view.

FIG. 8 shows a BAW resonator in a cross-sectional view. For building up such a resonator R, different functional layers are deposited on top of an electrically isolating substrate S. A first electrode layer E1 is deposited and structured to form the bottom electrode of the BAW resonator. A piezoelectric material layer PM is deposited and structured on top of the first electrode layer E1. At last, a second electrode layer is deposited and structured on top of the piezoelectric material PM to form a second electrode E2 of the resonator R.

Figure 9:
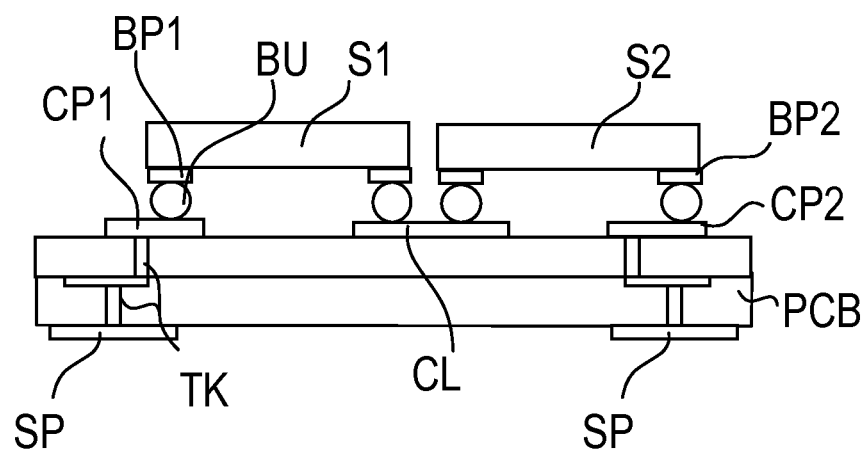
FIG. 9 shows the total reactance filter in a cross-sectional view.

FIG. 9 shows a reactance filter comprising a first and a second substrate S1, S2 mounted on top of a circuit board PCB. In the figure, the resonator structures are not shown for better understanding of the figure. The first substrate S1 with the first resonators is flip-chip mounted on top of the circuit board PCB by using bump technology. Thereby, electrical and mechanical contact between first bonding pads BP1 of the first substrate S1 and the first connection pad CP1 on top of the circuit board PCB is made in one step. One bump connection per each pair of assigned bonding pads BP and connection pads CP is used. Similarly, the second substrate S2 is also flip-chip mounted using respective bumps. Thereby, second bonding pads BP2 and second connection pads CP2 can be electrically and mechanically connected in one step. It is possible to mount first and second substrate at the same time. Alternatively, the two substrates can be mounted sequentially one after the other.

In the cross-sectional view of the circuit board PCB, through contacts TK are shown which may be guided straight through the whole circuit board PCB. Alternatively, as depicted in FIG. 9, according through contacts TK, each through single layers of the multi-layer circuit board may be laterally shifted against each other and connected by a conductor section within a metallization plane between two neighbored dielectric layers of the circuit board. Solder pads SP form external electrical terminals of the reactance filter and are arranged on the bottom of the circuit board and connected to the circuitry via through contacts TK.

FIG. 10 shows a reactance filter where two substrates S1, S2 are encapsulated via a common cover CV that is arranged over the first and second substrate to seal to the top surface of the circuit board and to enclose between cover CV and circuit board PCB a cavity for enclosing therein the two substrates. The cover may be rigid to enclose a fixed volume independently from the first and second substrate. It may be bonded to the circuit board with a layer of adhesive. If comprising a metallic material, the cover CV may be soldered to the metallization on top of the circuit board. In another embodiment, the cover may be a laminated foil which is applied on top of the circuit board and the two substrates to be in intimate contact with the backsides of the two substrates and the top surface of the circuit board. Thereby, an airtight sealing can result. The laminated foil may be a resin foil, preferably a resin foil that has some amount of an E modulus and gets some kind of sticky upon heating. This way, the foil can be adhered to the circuit board and the back surface of the substrate. Once the foil is laminated on top of the arrangement, the laminate may be reinforced by a further layer which may comprise a metal, for example. A metallic layer can provide an electromagnetic shield of the reactance filter. The shield can be enhanced by contacting the metallic layer of the cover to a ground connection. Alternative arrangements where a reactance filter as shown in FIG. 9 is enclosed in a casing is possible, too.

The invention has been explained by means of a limited number of figures and is thus not limited by the specific embodiments. Single elements of different figures can be combined in other ways to form further embodiments without declining from the invention. Especially, the number of impedance elements as well as the kind of impedance elements can deviate from the depicted examples. A rudimentary filter function is already achieved by a reactance filter comprising only one serial impedance element in the series branch and one parallel branch connected thereto comprising one parallel impedance element. Such a structure is called a basic element of a reactance filter and it is preferred to serially connect two or more such basic elements to result in a reactance filter showing a reasonable amount of attenuation beside the pass band.

The invention claimed is:

1. A reactance filter comprising:
   a series branch within which a plurality of series impedance elements that are coupled in series; and
   a plurality of parallel branches each having a parallel impedance element, each parallel impedance element being coupled to a node that is coupled to a respective series impedance element,
   wherein each impedance element comprises a resonator that works with acoustic waves,
   wherein the resonators in the series branch comprise a first piezoelectric material,
   wherein the resonators in the parallel branches comprise a second piezoelectric material that is different than the first piezoelectric material,
   wherein the first piezoelectric material has a smaller coupling coefficient than the second piezoelectric material, and
   wherein a capacitance element is coupled parallel to at least one of the resonators in the series branch.

2. The reactance filter of claim 1, wherein one or more of the impedance elements comprises the resonator and an inductance element coupled in series.

3. The reactance filter of claim 1, wherein one or more of the impedance elements comprises the resonator and a capacitance element coupled in parallel.

4. The reactance filter of claim 1, wherein one or more of the impedance elements comprises the resonator that is not coupled to a inductance element or capacitance element within the resonator.

5. The reactance filter of claim 1, wherein the resonators in the series branch and the resonators in the parallel branches are independently chosen from SAW (surface acoustic wave) resonators and resonators working with bulk acoustic waves.

6. The reactance filter of claim 1, wherein the first piezoelectric material has a greater coupling coefficient than the second piezoelectric material.

7. The reactance filter of claim 6, wherein a series inductance element is coupled in series to at least one of the resonators in the series branch.

8. The reactance filter of claim 1,
   wherein the resonators in the series branch are first resonators and the resonators in the parallel branch are second resonators,
   wherein the first and second resonators are arranged on a first and a second substrate separated according to a respective type of resonator, each substrate being the respective piezoelectric material or a carrier for a layer of the piezoelectric material from which respective resonators are formed, and
   wherein a dielectric layer is arranged on top of the first or second resonators between the substrate and an electrode of the respective resonator or above a respective electrode that is arranged directly on the piezoelectric material.

9. The reactance filter of claim 1,
   wherein a dielectric layer is arranged on top of both the resonators in the series branch and the resonators in the parallel branches, and
   wherein a thicknesses of the dielectric layer on top of the resonators in the series branch is different from a thickness of the dielectric layer on top of the resonators in the parallel branches.

10. The reactance filter of claim 1, wherein ones of the resonators are realized as SAW resonators on a piezoelectric material that has a greater coupling coefficient than other ones of the resonators.

11. The reactance filter of claim 1,
   wherein separate substrates are used for the resonators in the series branch and the resonators in the parallel branches,
   wherein the separate substrates are mounted on a common circuit board, and
   wherein all electrical couplings between the series branch and the parallel branches are made by conductor sections that are formed on the common circuit board.

12. The reactance filter of claim 11, wherein separate substrates are arranged within a common package comprising a cover encapsulating separate substrates and sealing to a top surface of the common circuit board.

13. The reactance filter of claim 11,
   wherein the resonators in the series branch are first resonators and the resonators in the Parallel branch are second resonators, wherein a first substrate of the separate substrates comprises a number of n first resonators, n being an integer with 2≤n≤6, wherein each resonator in the series branch is connected between two first bonding pads such that at least n+1 bonding pads are present, wherein a second substrate of the separate substrates comprises at least one ground bonding pad and a number of m second resonators, m being an integer with n−1≤m≤n+1, the resonators of the parallel branch each being connected between one second bonding pad and the at least one ground bonding pad, wherein the common circuit board comprises a number of m connection lines extending between a first and a second connection pad, the common circuit board further comprising at least one ground connection pad, wherein each first bonding pad is coupled to a first connection pad, wherein each second bonding pad is coupled to a second connection pad, and wherein the at least one ground bonding pad is coupled to the at least one ground connection pad.

14. The reactance filter of claim 13, wherein the at least one ground connection pad is connected via a inductive line to a ground terminal of the common circuit board.

15. The reactance filter of claim 11, wherein at least one series inductance element is formed on the common circuit board and connected to the series branch via a first bonding pad, the series inductance element being coupled between two resonators of the series branch or between a terminal of a resonator of the series branch and an input or an output terminal of the reactance filter.

16. A duplexer comprising:

a Tx filter; and an Rx filter, the Tx filter and the Rx filter each operating in a separate frequency band, wherein the Tx filter or the Rx filter comprises a series branch that includes a plurality of series impedance elements that are coupled in series and a plurality of parallel branches each having a parallel impedance element coupled to a respective node of the series branch, wherein each impedance element comprises a resonator that works with acoustic waves, the resonators in the series branch comprising a first piezoelectric material and the resonators in the parallel branches comprising a second piezoelectric material that is different than the first piezoelectric material, wherein the other of the Tx filter or the Rx filter also comprises a series branch that includes a plurality of series impedance elements that are coupled in series and a plurality of parallel branches each having a parallel impedance element coupled to a respective node of the series branch, wherein each impedance element comprises a resonator that works with acoustic waves, the resonators in the series branch comprising a first piezoelectric material and the resonators in the parallel branches comprising a second piezoelectric material that is different than the first piezoelectric material, wherein, in the Tx or Rx filter that operates in a lower band, the second piezoelectric material has a greater coupling coefficient than the first piezoelectric material or wherein, in the Tx or Rx filter that operates in a higher band, the first piezoelectric material has a greater coupling coefficient than the second piezoelectric material.

17. A reactance filter comprising:

a series branch within which a plurality of series impedance elements that are coupled in series; and a plurality of parallel branches each having a parallel impedance element, each parallel impedance element being coupled to a node that is coupled to a respective series impedance element, wherein each impedance element comprises a resonator that works with acoustic waves, wherein the resonators in the series branch comprise a first piezoelectric material, wherein the resonators in the parallel branches comprise a second piezoelectric material that is different than the first piezoelectric material, wherein a dielectric layer is arranged on top of both the resonators in the series branch and the resonators in the parallel branches, and wherein a thicknesses of the dielectric layer on top of the resonators in the series branch is different from a thickness of the dielectric layer on top of the resonators in the parallel branches.

18. A reactance filter comprising:

a series branch within which a plurality of series impedance elements that are coupled in series; and a plurality of parallel branches each having a parallel impedance element, each parallel impedance element being coupled to a node that is coupled to a respective series impedance element, wherein each impedance element comprises a resonator that works with acoustic waves, wherein the resonators in the series branch comprise a first piezoelectric material, wherein the resonators in the parallel branches comprise a second piezoelectric material that is different than the first piezoelectric material, and wherein ones of the resonators are realized as SAW resonators on a piezoelectric material that has a greater coupling coefficient than other ones of the resonators.

19. The reactance filter of claim 18, wherein separate substrates are used for the resonators in the series branch and the resonators in the parallel branches, wherein the separate substrates are mounted on a common circuit board, and wherein all electrical couplings between the series branch and the parallel branches are made by conductor sections that are formed on the common circuit board.

20. The reactance filter of claim 19, wherein separate substrates are arranged within a common package comprising a cover encapsulating separate substrates and sealing to a top surface of the common circuit board.

* * * * *